United States Patent
Ishida et al.

(10) Patent No.: US 6,598,004 B1
(45) Date of Patent: Jul. 22, 2003

(54) JITTER MEASUREMENT APPARATUS AND ITS METHOD

(75) Inventors: Masahiro Ishida, Tokyo (JP); Takahiro Yamaguchi, Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 340 days.

(21) Appl. No.: 09/650,000

(22) Filed: Aug. 28, 2000

(51) Int. Cl.⁷ .......................... G06F 19/00; H04B 17/00
(52) U.S. Cl. ........................ 702/69; 375/226; 324/76.77
(58) Field of Search ........................ 702/69, 79; 324/76, 324/77; 375/226

(56) References Cited

U.S. PATENT DOCUMENTS

| | | | | |
|---|---|---|---|---|
| 5,293,520 A | * | 3/1994 | Hayashi | 324/76.77 |
| 6,263,290 B1 | * | 7/2001 | Williams et al. | 702/71 |
| 6,356,850 B1 | * | 3/2002 | Wilstrup et al. | 702/69 |
| 2001/0037189 A1 | * | 11/2001 | Onu et al. | 702/191 |

OTHER PUBLICATIONS

Comer, "VCO Jitter Reduction with Bandpass Filtering", IEEE, 1995.*
Awad, "The Effects of Accumulated Timing Jitter on Some Sine Wave Measurements", IEEE, 1995.*
Yamaguchi et al., "Extraction of Peak–to–Peak and RMS Sinusoidal Jitter Using an Analytic Signal Method", IEEE, Apr. 2000.*
Yamaguchi et al., "Jitter Measurement of a PowerPC Microprocessor Using an Analytic Signal Method", IEEE, 2000.*

* cited by examiner

Primary Examiner—Patrick Assouad
(74) Attorney, Agent, or Firm—David N. Lathrop, Esq.; Gallagher & Lathrop

(57) ABSTRACT

A signal under measurement is converted into a digital signal by an AD converter, and a band-pass filtering process is applied to the digital signal to take out only components around a fundamental frequency of the signal under measurement. A data around a zero-crossing of the components around the fundamental frequency is interpolated to estimate a timing close to a zero-crossing point. A difference between adjacent timings in the estimated zero-crossing timing sequence is calculated to obtain an instantaneous period data sequence. A period jitter is obtained from the instantaneous period data sequence.

20 Claims, 15 Drawing Sheets

Jitter Measurement Apparatus 100

PRIOR ART

FIG. 6A          PRIOR ART
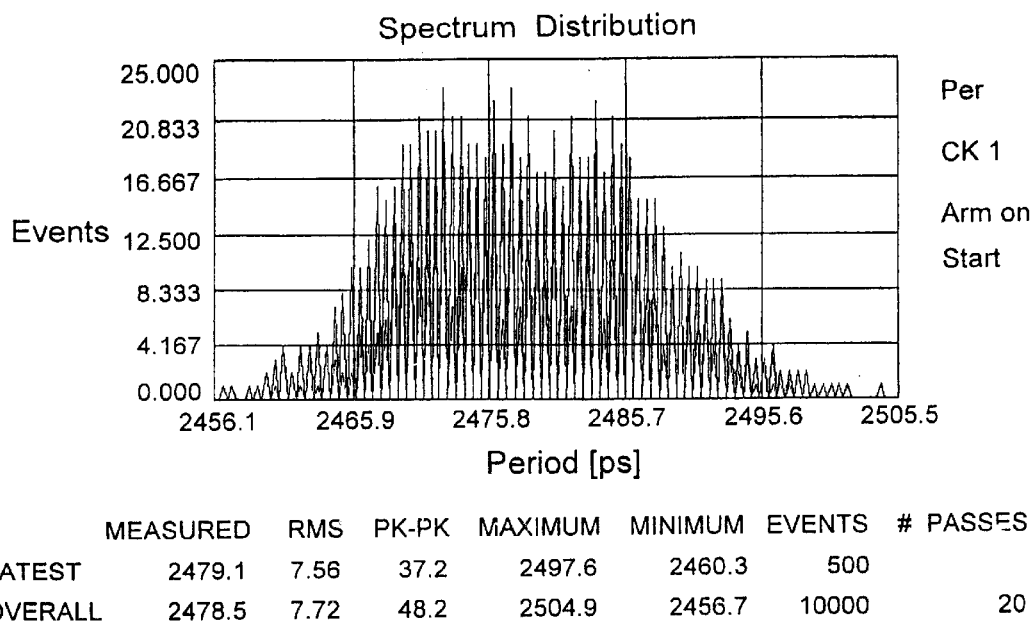
|         | MEASURED | RMS  | PK-PK | MAXIMUM | MINIMUM | EVENTS | # PASSES |
|---------|----------|------|-------|---------|---------|--------|----------|
| LATEST  | 2479.1   | 7.56 | 37.2  | 2497.6  | 2460.3  | 500    |          |
| OVERALL | 2478.5   | 7.72 | 48.2  | 2504.9  | 2456.7  | 10000  | 20       |
FIG. 6B          PRIOR ART
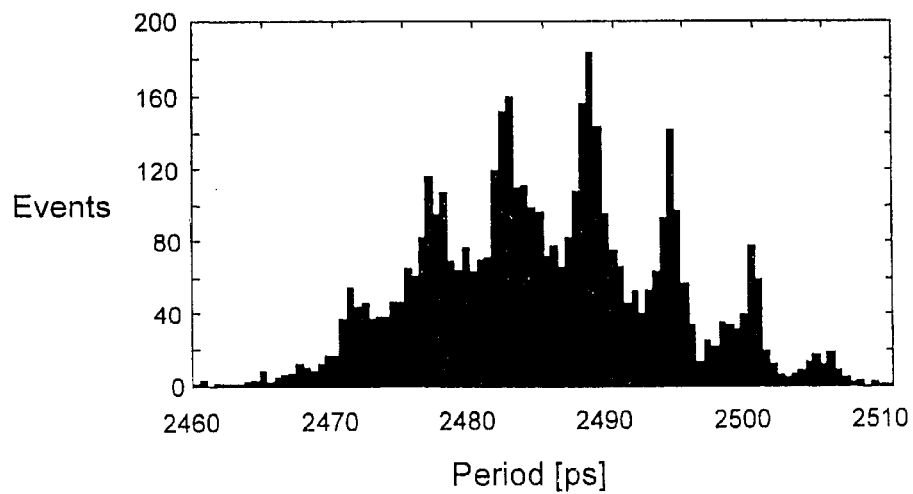
Number of Events : 4,573
RMS Jitter : 8.47 ps
Peak-to-Peak Jitter : 52.0 ps

| Method | | No. of Events | $J_{RMS}$ | $J_{PP}$ |
|---|---|---|---|---|
| Time Interval Analyzer | | 10,000 | 7.72 ps | 48.2 ps |
| Proposed Method | | 4,573 | 7.21 ps | 42.5 ps |
| Interpolation-based Method | | 4,573 | 8.47 ps | 52.0 ps |
| Difference | Proposed Method | -54% | -7% | -6% |
| | Interpolation-Based Method | -54% | +10% | +16% |

Jitter Measurement Apparatus 100

JITTER MEASUREMENT APPARATUS AND ITS METHOD

BACKGROUND OF THE INVENTION

The present invention relates to a jitter measurement apparatus and a jitter measuring method.

A Time Interval Analyzer or an oscilloscope has conventionally been used in a period jitter measurement. Each of those methods is called a Zero-crossing method. As shown in FIG. 1, a clock signal (a signal under measurement) x(t) from a PLL (Phase-Locked Loop) under test 11, for example, is supplied to a time interval analyzer 12.

Regarding a signal under measurement x(t), a next rising edge following one rising edge fluctuates against the preceding rising edge as indicated by dotted lines. That is, a time interval between two rising edges $T_p$, namely a period fluctuates. In the Zero-crossing method, a time interval (period) between zero-crossings is measured, a relative fluctuation of period is measured by a histogram analysis, and its histogram is displayed as shown in FIG. 2. A time interval analyzer is described in, for example, "Phase Digitizing Sharpens Timing Measurements" by D.Chu, IEEE Spectrum, pp.28–32, 1988 and "A Method of Serial Data Jitter Analysis Using One-Shot Time Interval Measurements" by J. Wilstrup, Proceedings of IEEE International Test Conference, pp.818–823, 1998.

On the other hand, Tektronix, Inc. and LeCroy co. have recently been providing digital oscilloscopes each being able to measure a jitter using an interpolation method. In this jitter measuring method using the interpolation method, data around a zero-crossing are interpolated from measured data of a signal under measurement that is sampled at high speed to estimate a timing of zero-crossing, whereby a time interval between zero-crossings (period) is estimated with a small error to measure a relative fluctuation of period.

That is, as shown in FIG. 3, a signal under measurement x(t) from the PLL under test 11 is inputted to a digital oscilloscope 14. In the digital oscilloscope 14, as shown in FIG. 4, the inputted signal under measurement x(t) is converted into a digital signal data sequence by an analog-to-digital converter 15. A data-interpolation is applied to data around a zero-crossing in the digital data sequence by an interpolator 16. With respect to the data-interpolated digital data sequence, a time interval between zero-crossings is measured by a period estimator 17. A histogram of the measured values is displayed by a histogram estimator 18, and a root-mean-square value and a peak-to-peak value of fluctuations of time intervals are obtained by an RMS & peak-to-peak detector 19. For example, in the case in which a signal under measurement x(t) is a waveform shown in FIG. 5A, its period jitters are measured as shown in FIG. 5B.

In the jitter measuring method by the time interval analyzer method, a time interval between zero-crossings is measured. Therefore a correct measurement can be performed. However, since there is, in this jitter measuring method, a dead-time when no measurement can be performed after one period measurement, there is a problem that it takes a long time to acquire a number of data that are required for a histogram analysis. In addition, in a jitter measuring method in which a wide-band oscilloscope and an interpolation method are combined, there is a problem that a jitter is overestimated (overestimation). That is, there is no compatibility in measured jitter values between this jitter measuring method and the time interval analyzer method. For example, a result of jitter measurement using a time interval analyzer for a clock signal of 400 MHz is shown in FIG. 6A, and a measured result of jitter measurement using an interpolation method for the same clock signal is shown in FIG. 6B.

Those measured results are, a measured value by the time interval analyzer 7.72 ps (RMS) vs. a measured value by the interpolation method 8.47 ps (RMS), and the latter is larger, i.e., the latter has overestimated the jitter value.

It is an object of the present invention to provide a jitter measurement apparatus and its method that can estimate a jitter value having compatibility with a conventional time interval analyzer method, i.e., a correct jitter value in a shorter time period.

SUMMARY OF THE INVENTION

The jitter measurement apparatus according to the present invention comprises: band-pass filtering means for selectively passing therethrough components from which harmonic components of a signal under measurement have been removed; zero-crossing timing estimating means for estimating zero-crossing timings of the signal that has passed through the band-pass filter; period estimating means for obtaining an instantaneous period waveform, namely an instantaneous period value sequence of the signal under measurement, from those estimated zero-crossing timings; and jitter detecting means for obtaining jitters of the signal under measurement from the instantaneous period waveform.

This jitter measurement apparatus includes AD converting means (analog-to-digital converter) for digitizing an analog signal and for converting it into a digital signal, and an input signal or an output signal of the band-pass filtering means is converted into a digital signal.

In addition, in this jitter measurement apparatus, the zero-crossing timing estimating means comprises: waveform data interpolating means for interpolating waveform data around the zero-crossing of the signal that has passed through the band-pass filtering means; zero-crossing specifying means for specifying a waveform data closest to the zero-crossing in the data-interpolated signal waveform; and timing estimating means for estimating a timing of the specified data.

It is desirable that the waveform data interpolating means uses polynomial interpolation, cubic spline interpolation, or the like.

In addition, the zero-crossing timing estimating means may estimate a zero-crossing timing by inverse linear interpolation from the waveform data around the zero-crossing in the signal that has passed through the band-pass filtering means.

It is desirable that the band-pass filtering means comprises: time domain to frequency domain transforming means for transforming the signal under measurement into a signal in frequency domain; a bandwidth limit processing means for taking out only components around a fundamental frequency of the signal from the output of the time domain to frequency domain transforming means; and frequency domain to time domain transforming means for inverse-transforming the output of the bandwidth limit processing means into a signal in time domain.

In this band-pass filtering means, if the signal under measurement is long, the signal under measurement is stored in a buffer memory. The signal under measurement is taken out in the sequential order from the buffer memory such that the signal under measurement being taken out is partially overlapped with a signal under measurement taken out just before. Each partial signal taken out from the buffer memory is multiplied by a window function, and the multiplied result is supplied to the time domain to frequency domain transforming means. The signal inverse-transformed in time domain is multiplied by an inverse number of the window function to obtain the band-limited signal.

In addition, it is desirable that the jitter measurement apparatus includes cycle-to-cycle period jitter estimating means to which the instantaneous period waveform obtained from the period estimating means is inputted for obtaining, in the sequential order, differential values each being a difference between adjacent instantaneous periods having a time difference of one period therebetween to calculate a differential waveform, and for outputting a cycle-to-cycle period jitter waveform data.

In addition, it is desirable in this jitter measurement apparatus to remove amplitude modulation components of the signal under measurement by waveform clipping means.

The jitter detecting means is constituted by one or a plurality of means out of peak-to-peak detecting means for obtaining a difference between the maximum value and the minimum value of the instantaneous period waveform or the cycle-to-cycle period jitter waveform, RMS detecting means for calculating a variance of the instantaneous period waveform data or the cycle-to-cycle period jitter waveform data to obtain the standard deviation, and histogram estimating means for obtaining a histogram of the instantaneous period waveform data or the cycle-to-cycle period jitter waveform data.

The functions of the present invention will be described below. A case in which a clock signal is used as a signal under measurement is shown as an example.

Jitter Measuring Method

In the jitter measuring method by time interval analyzer method, a fluctuation of a time interval between a zero-crossing and a next zero-crossing of a signal under measurement, i.e., a fluctuation of a period (fundamental period) of the signal under measurement is measured. This corresponds to measuring only frequency components around the fundamental frequency (corresponding to the fundamental period) of the signal under measurement. That is, a time interval analyzer method is a measuring method having a band-pass type frequency characteristic. on the other hand, a jitter value estimated by a sampling oscilloscope for measuring the entire frequency band of the signal under measurement using the interpolation method includes harmonic components. Consequently, the jitter value is influenced by the harmonic components, and hence a correct interpolation cannot be performed. In addition, the jitter value is not compatible with a jitter value measured by the conventional time interval analyzer method. For example, as shown in FIG. 6B, the jitter measuring method using the interpolation method overestimates a jitter value. On the contrary, a jitter value having compatibility with the time interval analyzer method can be estimated by measuring a period fluctuation between zero-crossings using a signal in which the frequency components of the signal under measurement are limited to the vicinity of the fundamental frequency by the band-pass filter. In addition, a jitter of a signal waveform having higher frequency can be measured by sampling a signal under measurement using a high-speed and wide-band sampling oscilloscope. Moreover, a measurement error of a period jitter can be decreased by using the interpolation method to decrease an estimation error of a zero-crossing timing.

In the jitter measuring method according to the present invention, at first for example, frequency components of a clock signal under measurement x(t) shown in FIG. 7A are band-limited, using a band-pass filter, to only the vicinity of the fundamental frequency of the signal x(t) such that at least harmonic components are not included therein. A band-limited clock waveform $x_{BP}(t)$ is shown in FIG. 7B. Then a zero-crossing timing of the band-limited clock signal $x_{BP}(t)$ is estimated as necessary using an interpolation method or an inverse-interpolation method to measure a time interval (instantaneous period) T between two zero-crossings. That is, a difference between the obtained zero-crossing timings is obtained in the sequential order at a predetermined interval. The period for obtaining the time difference between zero-crossing timing is n periods (n=0.5, 1, 2, 3, ... ). In the case of n=0.5, a time difference between a rising (or falling) zero-crossing timing and a next falling (rising) zero-crossing timing is obtained. In the case of n=1, a time difference between a rising (or falling) zero-crossing timing and a next rising (falling) zero-crossing timing is obtained. A measured instantaneous period waveform (instantaneous period value sequence) T[n] is, for example, shown in FIG. 8. Finally, an RMS (root mean square) value and a peak-to-peak value of period jitter are measured from the measured instantaneous period value sequemce T[n]. A period jitter J is a relative fluctuation of a period T against a fundamental period $T_0$, and is expressed by an equation (1).

$$T = T_0 + J \tag{1}$$

Therefore, an RMS jitter $J_{RMS}$ corresponds to a standard deviation of an instantaneous period T[n], and is given by an equation (2).

$$J_{RMS} = \sqrt{\frac{1}{N}\sum_{k=1}^{N}(T[K]-T')^2} \tag{2}$$

In this case, N is the number of samples of measured instantaneous period data, and T' is an average value of the instantaneous period data. In addition, a peak-to-peak period jitter $J_{PP}$ is a difference between the maximum value and the minimum value of T[n], and is expressed by an equation (3).

$$J_{PP} = \max_k(T[k]) - \min_k(T[k]) \tag{3}$$

FIG. 9A shows an example of a histogram of instantaneous periods measured by the jitter measuring method according to the present invention, and FIG. 9B shows a histogram measured by the corresponding conventional time interval analyzer so that a comparison with the histogram of the present invention can be made. In addition, FIG. 10 shows an RMS value and a peak-to-peak value of period jitter measured by the jitter measuring method according to the present invention as well as the respective values measured by the conventional time interval analyzer. Here, the peak-to-peak value $J_{PP}$ of the observed period jitter is substantially proportional to a square root of logarithm of the number of events (the number of zero-crossings). In the case of approximately 5000 events, $J_{PP}$=45 ps is a correct value. A $J_{PP}$ error in FIG. 10 is shown assuming that 45 ps is the correct value. As shown in FIGS. 9 and 10, the jitter measuring method according to the present invention can obtain a measured result that is closer to a result of the conventional time interval analyzer method than a measured result of the conventional interpolation method is. That is, the jitter measuring method according to the present invention can obtain a measured value of jitter that is compatible with the conventional time interval analyzer method.

Moreover, the jitter measuring method according to the present invention can simultaneously measure a cycle-tocycle period jitter. A cycle-to-cycle period jitter $J_{CC}$ is a period fluctuation between continuous cycles, and is expressed by an equation (4).

$$J_{CC}[k]=T[k+1]-T[k] \quad (4)$$

Therefore, by calculating a difference for each cycle period between the instantaneous period data measured as described above, and by calculating its standard deviation and a difference between the maximum value and the minimum value, an RMS value $J_{CC,RMS}$ and a peak-to-peak value $J_{CC,PP}$ of cycle-to-cycle period jitter can be obtained.

$$J_{CC,RMS} = \sqrt{\frac{1}{M}\sum_{k=1}^{M} J_{CC}^2[K]} \quad (5)$$

$$J_{CC,PP} = \max_k (J_{CC}[k]) - \min_k (J_{CC}[k]) \quad (6)$$

In this case, M is the number of samples of differential data of measured instantaneous periods. A waveform of cycle-to-cycle jitter $J_{CC}[k]$ is, for example, shown in FIG. 11.

In the jitter measuring method according to the present invention, band-pass filtering means may be applied after an analog signal under measurement has been digitized, or the band-pass filtering means may be applied first to an analog signal under measurement and then its output waveform may be digitized. As the band-pass filtering means, an analog filter is used in the latter case. In the former case, a digital filter may be used, or the band-pass filtering means may be constituted by software using Fourier transform. In addition, it is desirable to use, for the digitization of an analog signal, a high speed AD converter, a high speed digitizer or a high speed digital sampling oscilloscope (that is, this jitter measurement apparatus may be integrated, as an option, into the sampling oscilloscope).

In addition, in the jitter measuring method according to the present invention, a period jitter can be estimated with high accuracy by removing, by waveform clipping means, amplitude modulation (AM) components of a signal under measurement to retain only phase modulation (PM) components corresponding to a jitter.

Band-Pass Filter

A band-limitation of a digitized digital signal can be materialized by a digital filter, or can also be achieved by Fourier transform. Next, a band-pass filter using FFT (Fast Fourier Transform) will be described. FFT is a method of transforming at high speed a signal waveform in time domain into a signal in frequency domain.

First, for example, a digitized signal under measurement x(t) shown in FIG. 12 is transformed into a signal in frequency domain X(f) by FFT. FIG. 13 shows a power spectrum of the transformed signal X(f). Then, the signal X(f) is band-limited such that only data around the fundamental frequency are retained and the other data are made zero. FIG. 14 shows this band-limited signal in frequency domain $X_{BP}(f)$. In this example, the fundamental frequency 400 MHz is used as a central frequency, and a harmonic component of 800 MHz is removed by making a pass band width 400 MHz. Finally, inverse FFT is applied to the band-limited signal $X_{BP}(f)$, whereby a band-limited signal waveform in time domain $x_{BP}(t)$ can be obtained. A band-limited signal waveform in time domain $x_{BP}(t)$ thus obtained is shown in FIG. 15.

Timing Estimation by Interpolation Method

When values of a function y=f(x) are given for discontinuous values $x_1, x_2, x_3, \ldots, x_n$ of a variable x, "interpolation" is to estimate a value of f(x) for a value of x other than $x_k$ (k=1, 2, 3, ..., n) between $x_k$ and $x_{k+1}$.

In the timing estimation using an interpolation method, for example as shown in FIG. 16, an interval between two measurement points $x_k$ and $x_{k+1}$ that contains a predetermined value $y_c$, for example zero, is interpolated in sufficiently detail. After that an interpolated data closest to the predetermined value $y_c$ is searched, whereby a timing x when a function value y becomes the predetermined value $y_c$ is estimated. In order to make a timing estimation error small, it is desirable that y(x) is interpolated by making a time interval between the two measurement points $x_k$ and $x_{k+1}$ equal time length and by making the time interval as short as possible.

Polynomial Interpolation

First, an interpolation method using a polynomial will be described. Polynomial interpolation is described, for example, in "Numerical Analysis" by L. W. Johnson and R. D. Riess, Massachusetts: Addison-Wesley, pp. 207–230, 1982.

When two points $(x_1, y_1)$ and $(x_2, Y_2)$ on a plane are given, a line $y=P_1(x)$ that passes through these two points is given by an equation (7). and is unitarily determined.

$$y=P_1(x)=\{(x-x_2)/(x_1-x_2)\}y_1+\{(x-x_1)/(x_2-x_1)\}y_2 \quad (7)$$

Similarly, a quadratic curve $y=P_2(x)$ that passes through three points $(x_1, Y_1), (x_2, Y_2)$ and $(X_3, y_3)$ on a plane is given by an equation (8).

$$y = P_2(x) = \quad (8)$$

$$\frac{(x-x_2)(x-x_3)}{(x_1-x_2)(x_1-x_3)}y_1 + \frac{(x-x_1)(x-x_3)}{(x_2-x_1)(x_2-x_3)}y_2 + \frac{(x-x_1)(x-x_2)}{(x_3-x_1)(x_3-x_2)}$$

In general, , a curve of (N–1)th degree $y=P_{N-1}(x)$ that passes through N points $(x_1, y_1), (x_2, y_2) \ldots (x_N, y_N)$ on a plane is unitarily determined, and is given by an equation (9) from the Lagrange's classical formula.

$$y = P_{N-1}(x) = \frac{(x-x_2)(x-x_3)\ldots(x-x_N)}{(x_1-x_2)(x_1-x_3)\ldots(x_1-x_N)}y_1 + \quad (9)$$

$$\frac{(x-x_1)(x-x_3)\ldots(x-x_N)}{(x_2-x_1)(x_2-x_3)\ldots(x_2-x_N)}y_2 + \ldots +$$

$$\frac{(x-x_1)(x-x_2)\ldots(x-x_{N-1})}{(x_N-x_1)(x_N-x_2)\ldots(x_N-x_{N-1})}y_N$$

In the interpolation by polynomial of (N–1)th degree, a value of y=f(x) for a desired x is estimated from N measurement points using the above equation (9). In order to obtain a better approximation of an interpolation curve $P_{N-1}(x)$, it is desirable to select N points in the proximity of x. This polynomial interpolation is a method that is frequently used.

Cubic Spline Interpolation

Next, cubic spline interpolation will be described. Cubic spline interpolation is described, for example, in "Numerical Analysis" by L. W. Johnson and R. D. Riess, Massachusetts: Addison-Wesley, pp. 237–248, 1982.

"Spline" means an adjustable ruler (thin elastic rod) used in drafting. When a spline is bended such that the spline passes through predetermined points on a plane, a smooth curve (spline curve) concatenating those points is obtained. This spline curve is a curve that passes through the predetermined points, and has the minimum value of square integral (proportional to the transformation energy of spline) of its curvature.

When two points $(x_1, y_1)$ and $(x_2, Y_2)$ on a plane are given, a spline curve that passes through these two points is given by an equation (10).

$$y = Ay_1 + By_2 + Cy_1'' + Dy_2''$$

$$A \equiv (x_2-x)/(x_2-x_1)$$

$$B \equiv 1-A = (x-x_1)/(x_2-x_1)$$

$$C \equiv (1/6)(A^3-A)(x_2-x_1)^2$$

$$D \equiv (1/6)(B^3-B)(x_2-x_1)^2 \qquad (10)$$

Here, $y_1''$ and $Y_2''$ are the second derivative values of the function $y=f(x)$ at $(x_1, y_1)$ and $(x_2, Y_2)$, respectively.

In the cubic spline interpolation, a value of $y=f(x)$ for a desired x is estimated from two measurement points and the second derivative values at the measurement points using the above equation (10). In order to obtain a better approximation of an interpolation curve, it is desirable to select two points in the proximity of x.

Timing Estimation by Inverse Linear Interpolation

Inverse interpolation is a method of conjecturing, when a value of a function $y_k = f(x_k)$ is given for a discontinuous value $x_1, x_2, \ldots, x_n$ of a variable x, a value of $g(y)=x$ for an arbitrary y other than discontinuous $y_k$ (k=1, 2, ... n) by defining an inverse function of $y=f(x)$ to be $x=g(y)$. In the inverse linear interpolation, the linear interpolation is used in order to conjecture a value of x for y.

When two points $(x_1, y_1)$ and $(x_2, y_2)$ on a plane are given, a linear line that passes through these two points is given by an equation (11).

$$y = \{(x-x_2)/(x_1-x_2)\}y_1 + \{(x-x_1)/(x_2-x_1)\}y_2 \qquad (11)$$

An inverse function of the above equation is given by an equation (12), and a value of x for y can unitarily be obtained.

$$x = \{(y-y_2)/(y_1-y_2)\}x_1 + \{(y-y_1)/(y_2-y_1)\}x_2 \qquad (12)$$

In the inverse linear interpolation, as shown in FIG. 17, a value of $x=g(y_c)$ for a desired $y_c$ is estimated from two measurement points $(x_k, y_k)$ and $(x_{k+1}, y_{k+1})$ using the above equation (12), whereby a timing x for obtaining a predetermined voltage value $y_c$ is unitarily be estimated. In order to reduce an estimation error, it is desirable to select two points $x_k$ and $x_{k+1}$ between which x is contained. This inverse linear interpolation is also used frequently.

Waveform Clipping

Waveform clipping means removes AM (amplitude modulation) components from an input signal, and retains only PM (phase modulation) components corresponding to a jitter. Waveform clipping is performed by applying the following processes to an analog input signal or a digital input signal; 1) multiplying the value of the signal by a constant, 2) replacing a signal larger than a predetermined threshold 1 with the threshold 1, 3) replacing a signal smaller than a predetermined threshold 2 with the threshold 2. Here, it is assumed that the threshold 1 is larger than the threshold 2. FIG. 18A shows an example of a clock signal having AM components. Since the envelope of the time based waveform of this signal fluctuates, it is seen that this signal contains AM components. FIG. 18B shows a clock signal that is obtained by clipping this clock signal using clipping means. Since the time based waveform of this signal shows a constant envelope, it can be ascertained that the AM components have been removed.

BRIEF DESCRIPTION OF THE DRAWINGS

FIG. 6A is a diagram showing a measured result of jitters measured by a time interval analyzer method;

FIG. 6B is a diagram showing a measured result of jitters measured by the conventional interpolation method;

DESCRIPTION OF A PREFERRED EMBODIMENT

An embodiment of the present invention will be described below.

Figure 1:
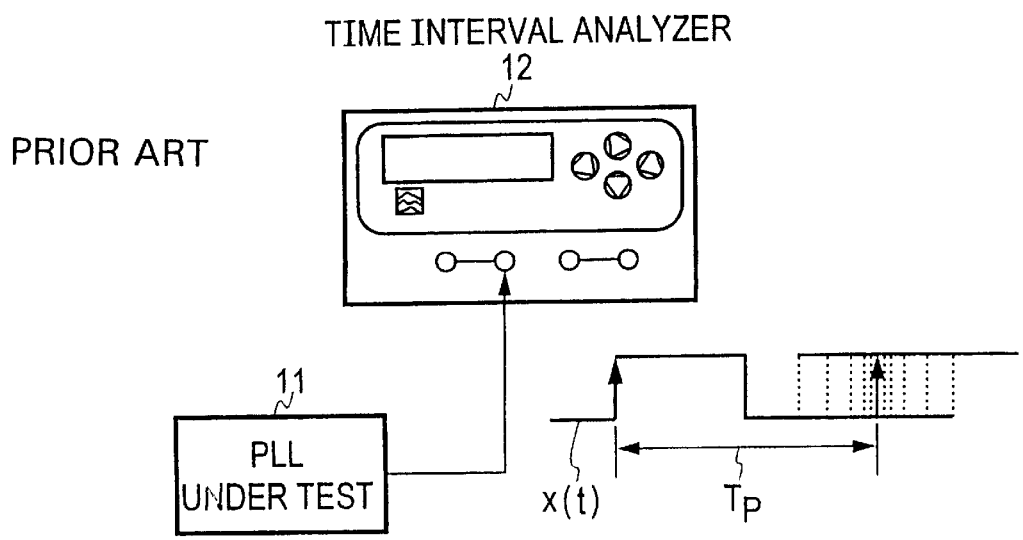
FIG. 1 is a diagram showing a jitter measuring setup using a time interval analyzer.
Figure 2:
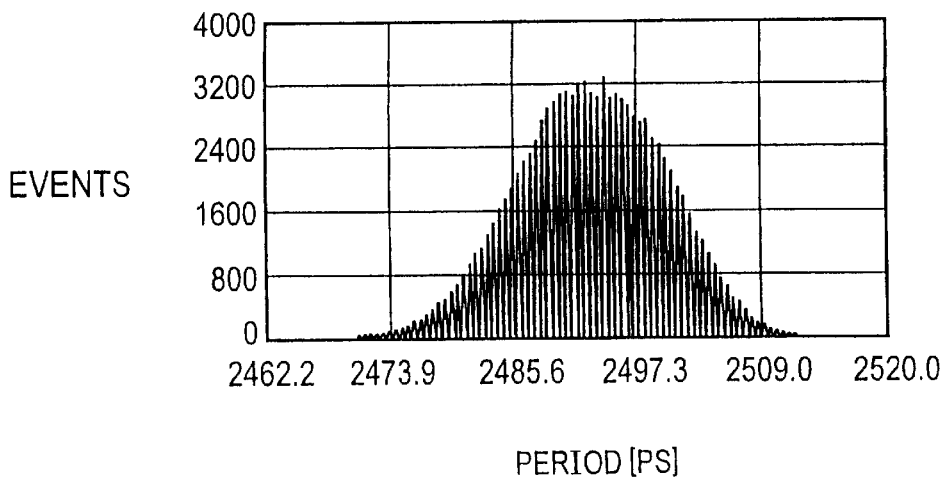
FIG. 2 is a diagram showing an example of a histogram of period jitters measured by a time interval analyzer.
Figure 3:
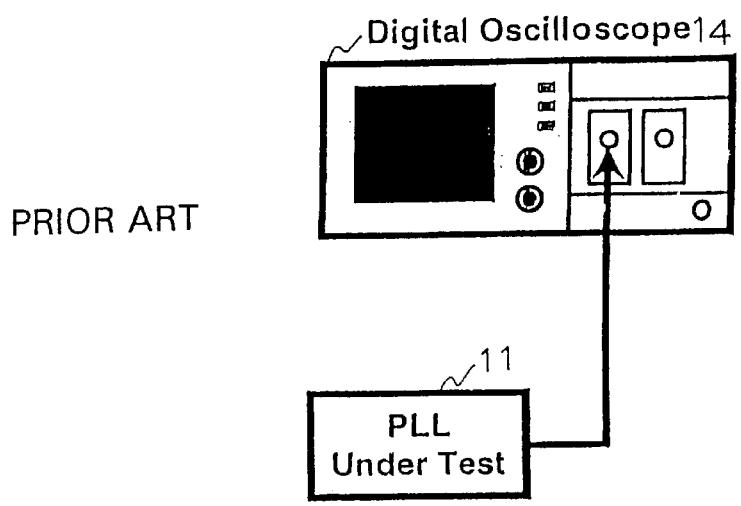
FIG. 3 is a diagram showing a jitter measuring setup using an interpolation method (oscilloscope)
Figure 4:
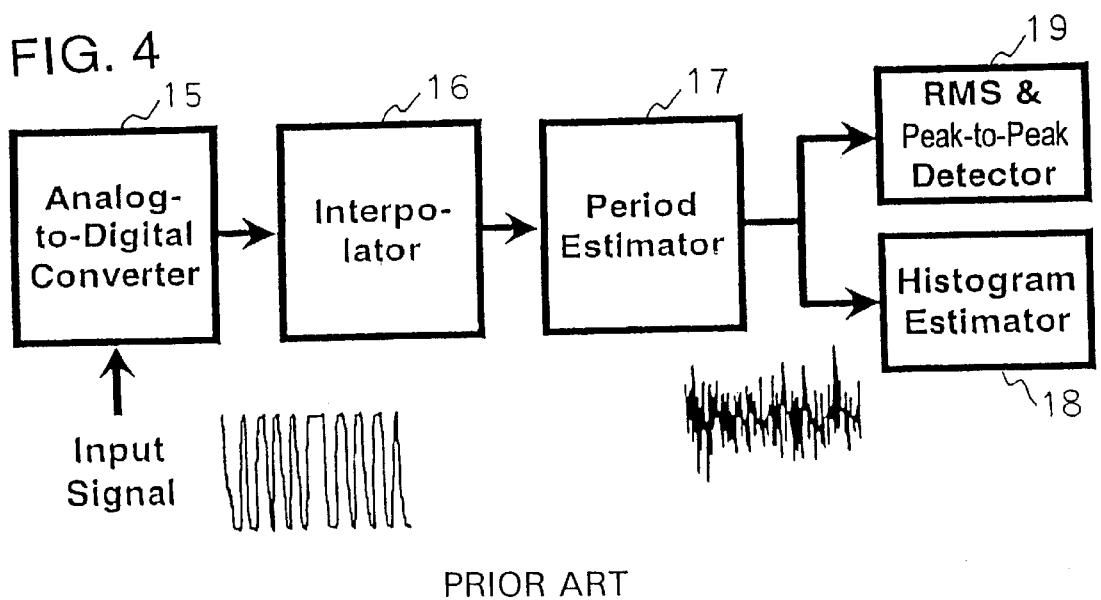
FIG. 4 is a block diagram showing a jitter measuring functional structure using the interpolation method shown in FIG. 3.
Figure 5A:
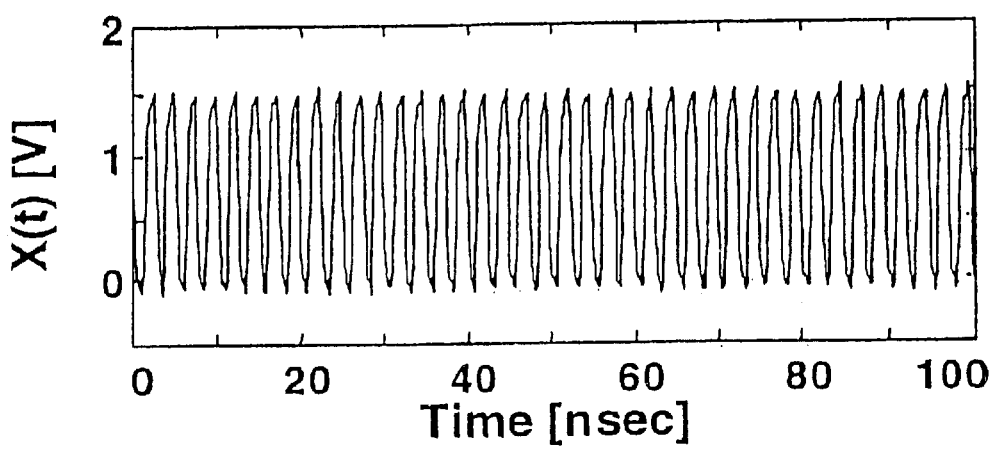
FIG. 5A is a diagram showing a waveform example of a signal under measurement.
Figure 5B:
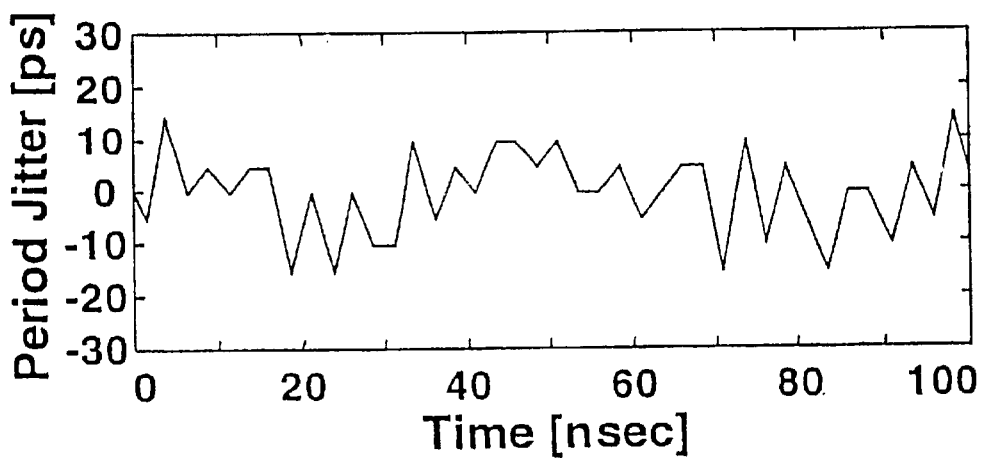
FIG. 5B is a diagram showing a waveform example of measured period jitters.
Figure 7A:
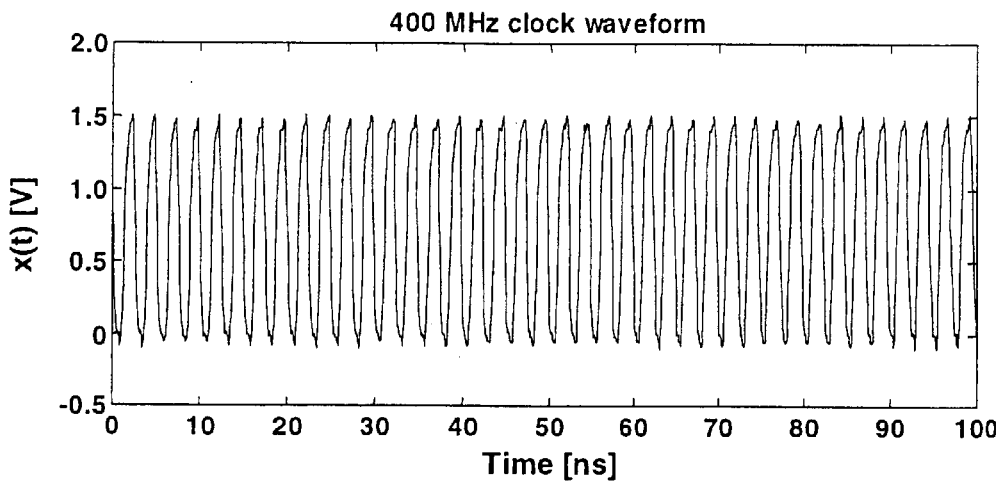
FIG. 7A is a diagram showing a waveform example of a clock signal under measurement.
Figure 7B:
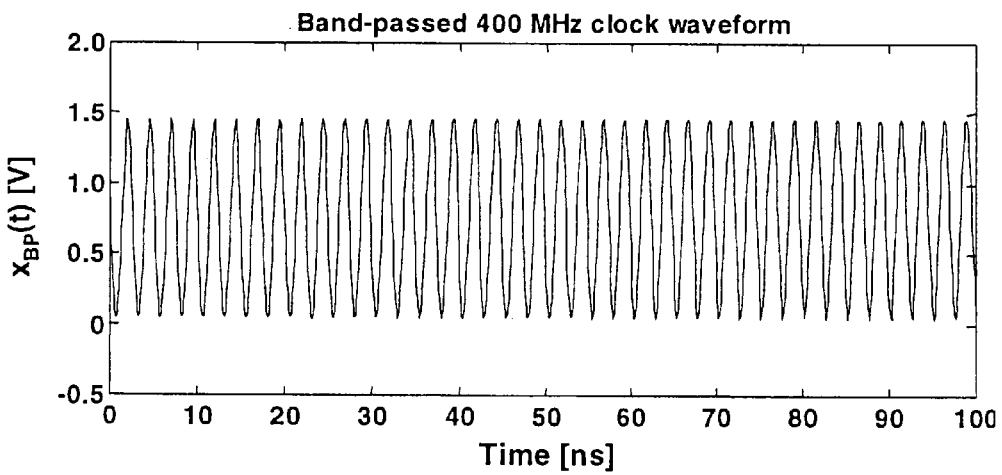
FIG. 7B is a diagram showing a waveform example of a band-limited clock signal under measurement.
Figure 8:
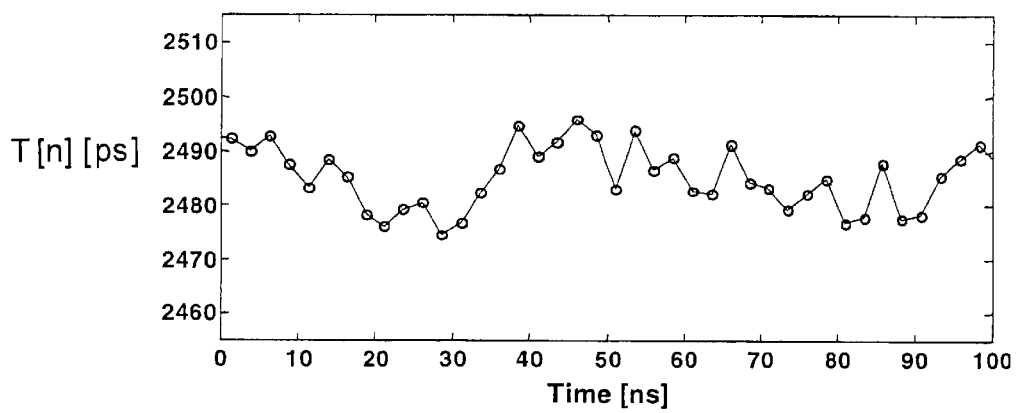
FIG. 8 is a diagram showing an example of an instantaneous period waveform.
Figure 9A:
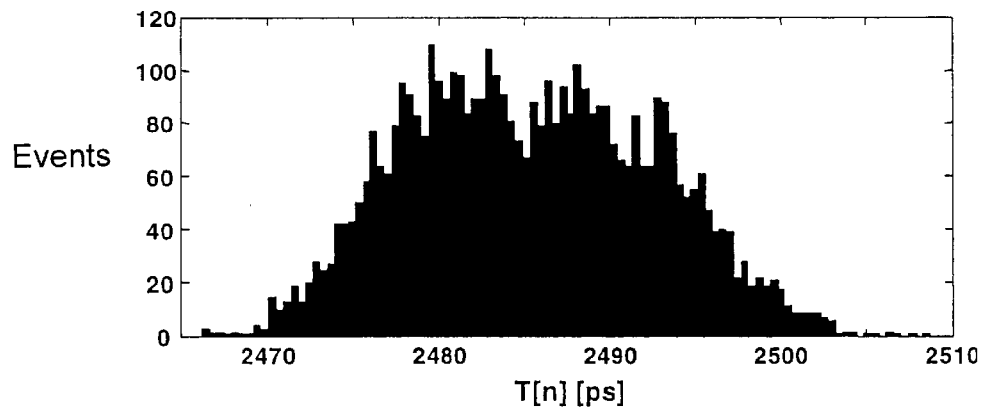
FIG. 9A is a diagram showing a histogram of period jitters measured by a jitter measuring method according to the present invention.
Figure 9B:
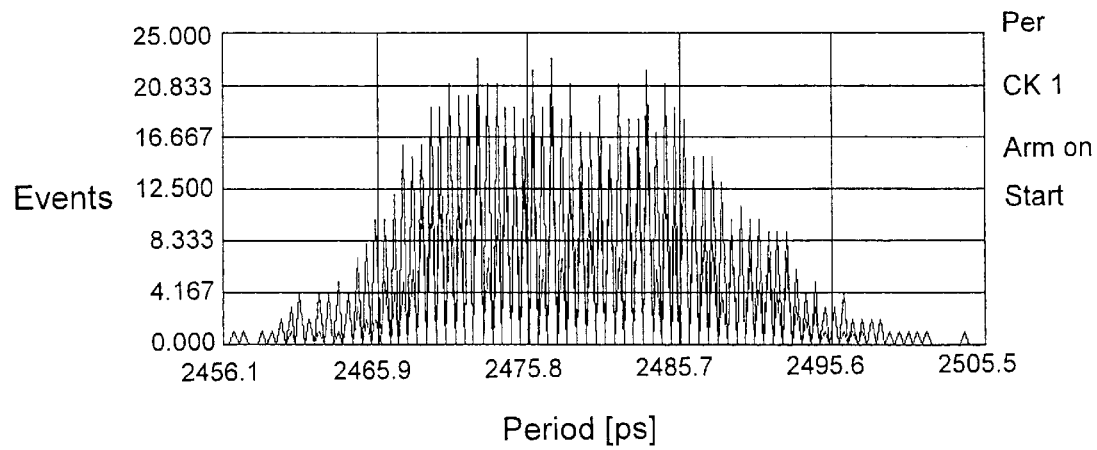
FIG. 9B is a diagram showing a histogram of period jitters measured by the time interval analyzer method.
Figures 10, 11:
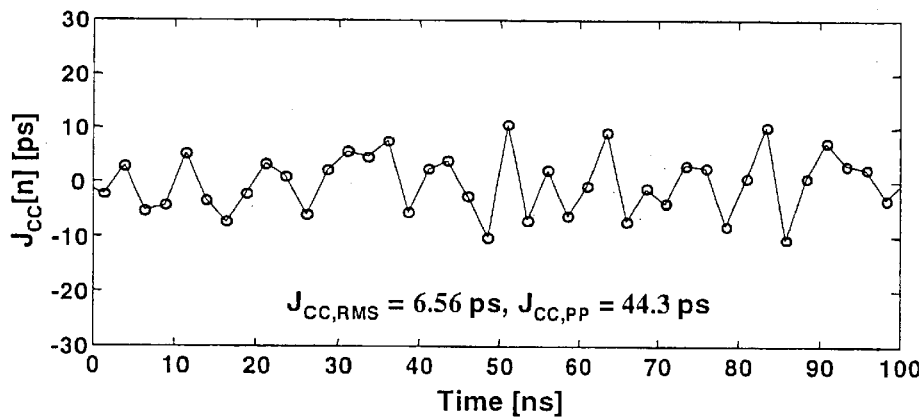
FIG. 10 is a diagram showing a measured result of jitters measured by the conventional methods and a measured result of jitters measured by the present invention.
FIG. 11 is a diagram showing an example of a waveform of cycle-to-cycle period jitters.
Figure 12:
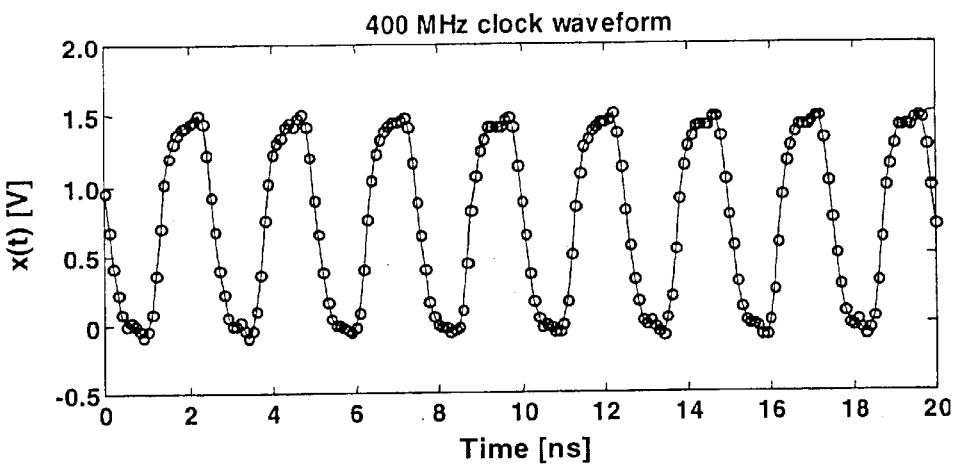
FIG. 12 is a diagram showing an example of a digitized signal under measurement.
Figure 13:
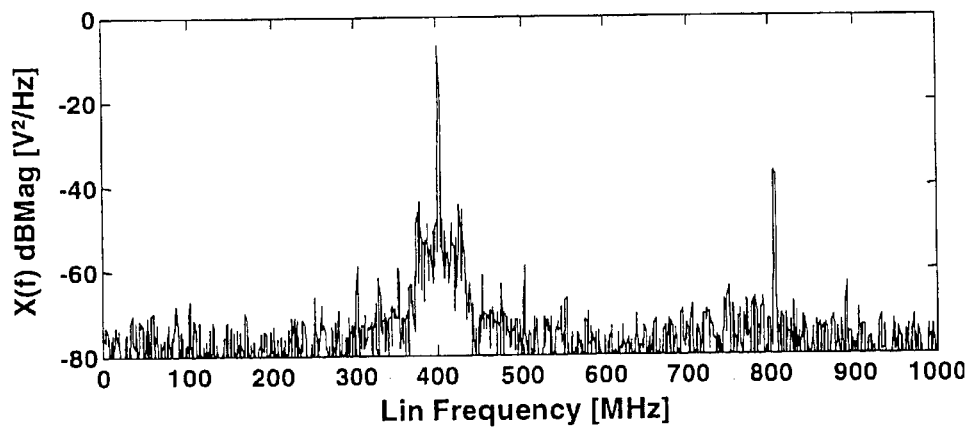
FIG. 13 is a diagram showing an example of a power spectrum of a signal under measurement obtained by FFT.
Figure 14:
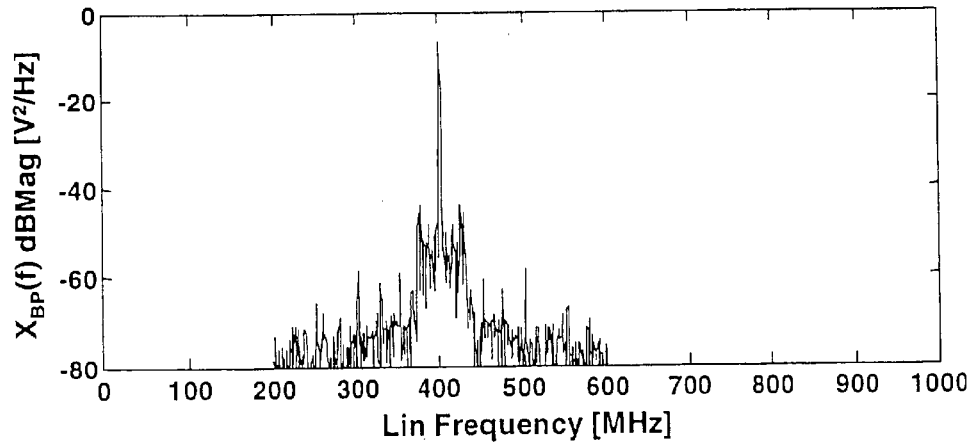
FIG. 14 is a diagram showing an example of a band-limited power spectrum.
Figure 15:
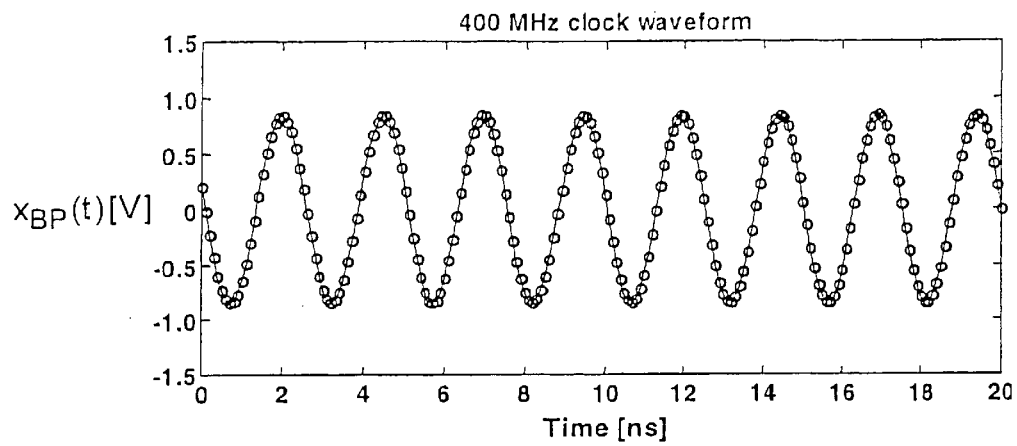
FIG. 15 is a diagram showing an example of a band-limited signal under measurement obtained by applying inverse FFT.
Figure 16:
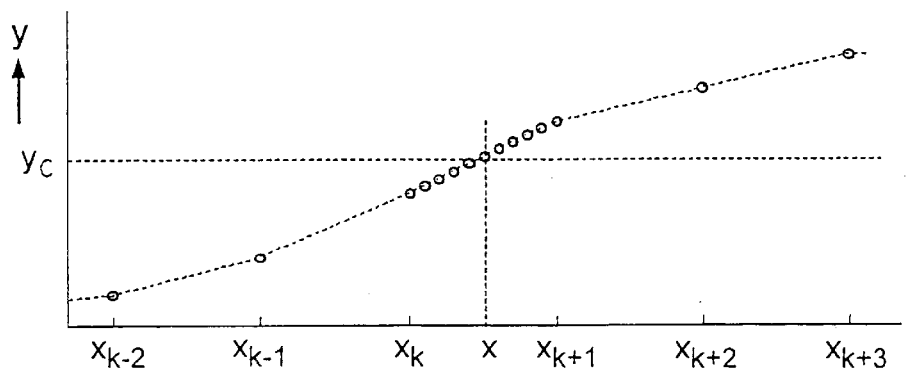
FIG. 16 is a diagram showing an example of a timing estimation using the interpolation method.
Figure 17:
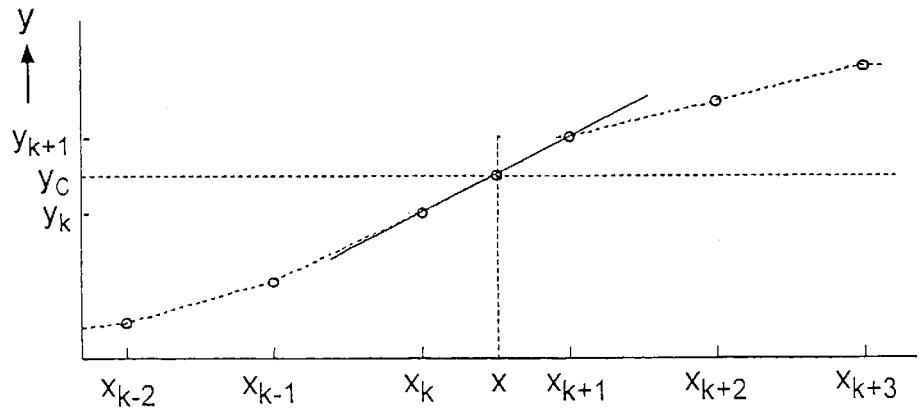
FIG. 17 is a diagram showing an example of a timing estimation using inverse linear interpolation.
Figure 18A:
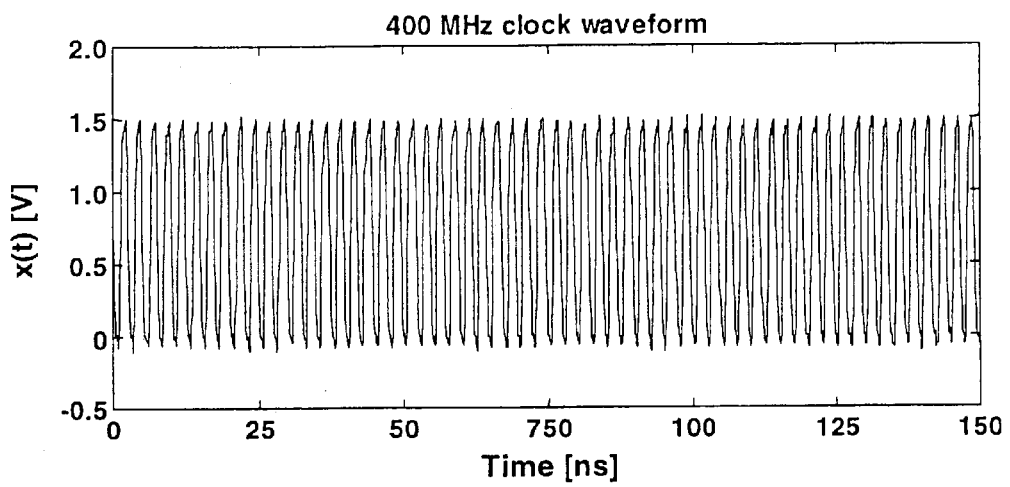
FIG. 18A is a diagram showing an example of a clock signal under measurement that contains AM components.
Figure 18B:
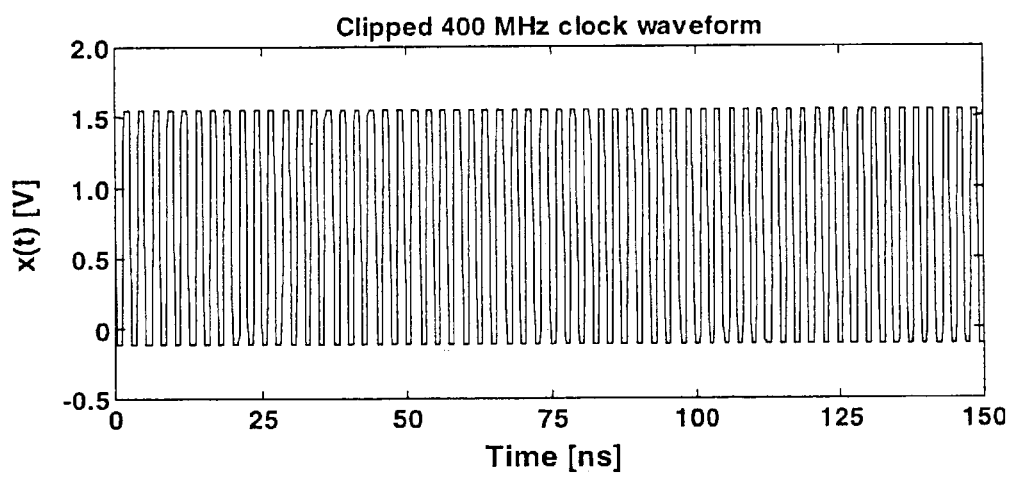
FIG. 18B is a diagram showing an example of a clock signal under measurement that does not contain AM components.
Figure 19:
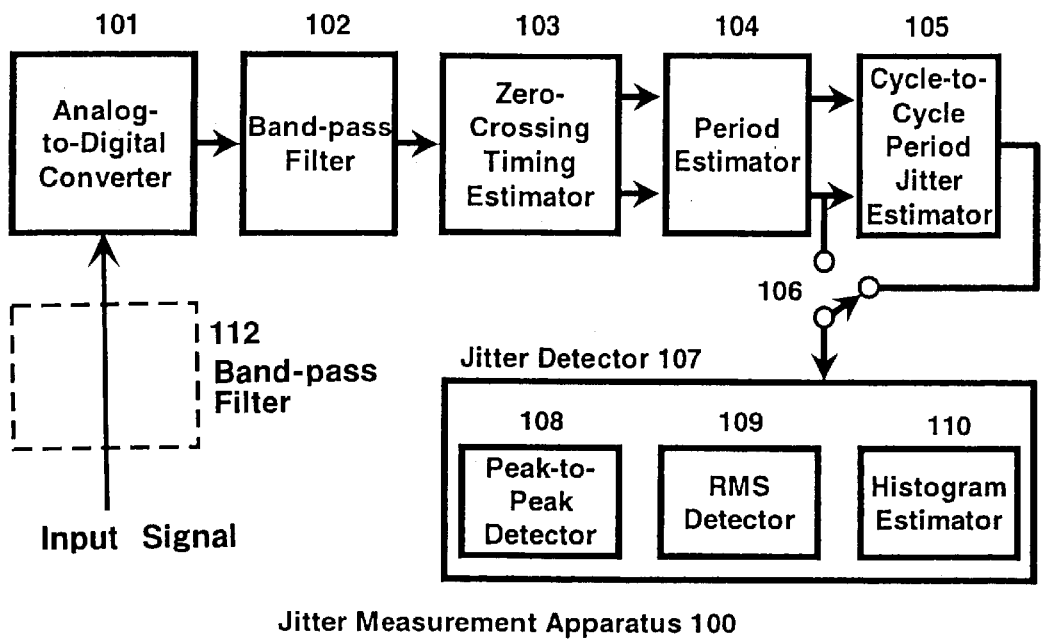
FIG. 19 is a diagram showing an example of a functional configuration of a jitter measurement apparatus according to the present invention.

FIG. 19 shows the embodiment of the present invention. In this jitter measurement apparatus 100, an analog signal under measurement is inputted to an AD converter 101, by which the signal under measurement is converted into a digitized digital signal. The digitized signal under measurement is inputted to a band-pass filter 102, through which frequency components around the fundamental frequency are selectively passed. The signal that has passed through the band-pass filter 102 is supplied to a zero-crossing timing estimator 103, where, in this example, a zero-crossing timing of the signal is estimated. The estimated zero-crossing timing is supplied to a period estimator 104, where an instantaneous period waveform data is obtained from the timing. The instantaneous period waveform data is supplied to a cycle-to-cycle period jitter estimator 105, where a differential waveform of the periods is calculated and a cycle-to-cycle waveform jitter waveform data is outputted. An output signal from the period estimator 104 or an output signal from the cycle-to-cycle period jitter estimator 105 is selected by a switch 106, and the selected signal is supplied to a jitter detector 107. In the jitter detector 107, a jitter of the signal under measurement is obtained from the instantaneous period waveform data or the cycle-to-cycle period jitter waveform data. There is shown a case in which the jitter detector 107 comprises a peak-to-peak detector 108 for obtaining a difference between the maximum value and the minimum value of the instantaneous period waveform data or the cycle-to-cycle period jitter waveform data, an RMS detector 109 for calculating a variance of the instantaneous period waveform data or the cycle-to-cycle period jitter waveform data to obtain its standard deviation (RMS value), and a histogram estimator 110 for obtaining a histogram of the instantaneous period waveform data or the cycle-to-cycle period jitter waveform data. The jitter detector 107 may comprise one or a plurality of those components. The band-pass filter 102 may be a digital filter, or may be a band-pass filter that is constituted by a software using FFT or the like.

Figure 20:
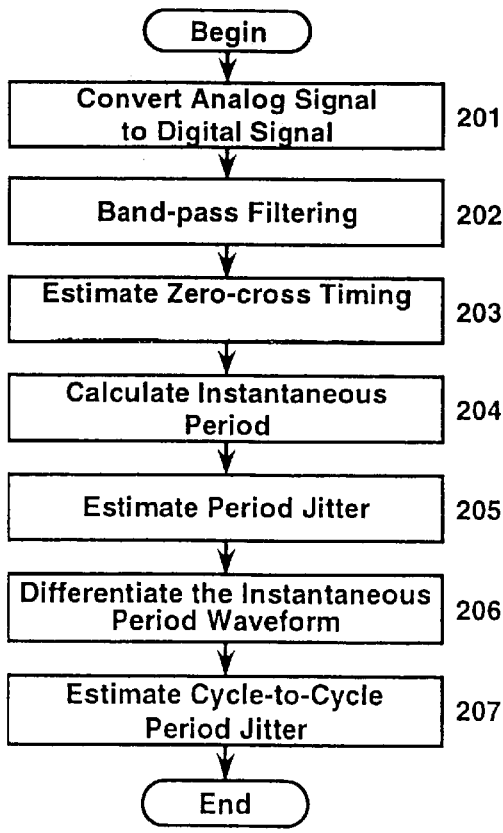
FIG. 20 is a flow-chart showing an example of a jitter measuring method according to the present invention.

Next, the operation in the case of performing a jitter measurement of a signal under measurement using the jitter measurement apparatus 100 according to the present invention will be described. FIG. 20 shows a processing procedure of the jitter measuring method according to the present invention. First, in step 201, an analog signal under measurement whose jitter is to be measured is sampled (digitized) by the AD converter 101, and the analog signal under measurement is converted into a digital signal. Next, in step 202, the fundamental frequency component and its vicinity components of the digitized signal under measurement are selectively passed through the band-pass filter 102 so that a band-limitation for removing the harmonic components from the signal under measurement is preformed. Next, in step 203, a zero-crossing timing of the signal that has passed through the band-pass filter 102 is estimated by the zero-crossing timing estimator 103.

Next, in step 204, a difference (time difference) between two zero-crossing timing estimated by the zero-crossing timing estimator 103 and a is calculated to obtain an instantaneous period waveform of the signal under measurement. Next, in step 205, a period jitter of the signal under measurement is obtained by the jitter detector 107 from the instantaneous period waveform data in the state of connecting the switch 106 to the side of the period estimator 104. Next, in step 206, a differential waveform for each fundamental period of the instantaneous period waveform data obtained from the period estimator 104 is calculated by the cycle-to-cycle period jitter estimator 105 to obtain a cycle-to-cycle period jitter waveform data. Finally, in step 207, a cycle-to-cycle period jitter is obtained by the jitter detector 107 from the cycle-to-cycle period jitter waveform data in the state of connecting the switch 106 to the side of the cycle-to-cycle period jitter estimator 105. Then the process ends.

That is, the instantaneous period waveform data from the period estimator 104 may be supplied to the jitter detector 107 via the cycle-to-cycle period jitter estimator 105. In addition, the switch 106 may be omitted to directly connect the period estimator 104 to the jitter detector 107. In this case, the cycle-to-cycle period jitter estimator 105 is omitted. Alternatively, the switch 106 may be omitted to directly connect the cycle-to-cycle period jitter estimator 105 to the jitter detector 107. In the step 205 for obtaining a period jitter of the signal under measurement, the peak-to-peak detector 108 obtains a peak-to-peak value of period jitter using the equation (3), the RMS detector 109 obtains an RMS value of period jitter using the equation (2), and the histogram estimator 110 obtains a histogram from the instantaneous period waveform data. An RMS period jitter may be obtained from the histogram. In addition, in the step 207 for obtaining a cycle-to-cycle period jitter of the signal under measurement, the peak-to-peak detector 108 obtains a peak-to-peak value of cycle-to-cycle jitter using the equation (6), the RMS detector 109 obtains an RMS value of cycle-to-cycle period jitter using the equation (5), and the histogram estimator 110 obtains a histogram from the cycle-to-cycle period jitter waveform data. An RMS value of cycle-to-cycle period jitter may be obtained from the histogram.

Figure 21:
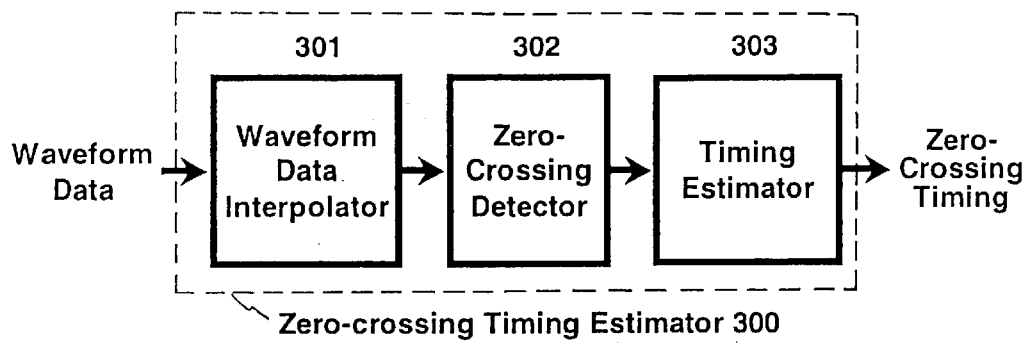
FIG. 21 is a diagram showing an example of a configuration of zero-crossing timing estimating means used in the jitter measurement apparatus according to the present invention.

In the step 203 for estimating the zero-crossing timing, the polynomial interpolation using the equation (9), the cubic spline interpolation using the equation (10) or the like may be used. By interpolating a waveform data around a zero-crossing, a timing may be estimated more correctly, or a timing may also be estimated more correctly using the inverse linear interpolation shown in the equation (12). That is, the zero-crossing timing estimator 103 may be constructed as shown in FIG. 21 to estimate a zero-crossing timing using the processing procedure shown in FIG. 22, or a zero-crossing timing may be estimated from two waveform data around a zero-crossing by the inverse linear interpolation using the equation (12). That is, the zero-crossing timing estimator 103 in FIG. 19 may be an estimator for estimating a zero-crossing timing by the inverse linear interpolation from waveform data around a zero-crossing of the band-limited signal waveform data.

The zero-crossing timing estimator 300 shown in FIG. 21 comprises a waveform data interpolator 301 for interpolating a waveform data around a zero-crossing of a signal that has passed through the band-pass filter 102, a zero-crossing detector 302 for specifying a waveform data closest to the zero-crossing among the data-interpolated signal waveform data, and a timing estimator 303 for estimating a timing of the specified data. The waveform data interpolator 301 may estimate a waveform data using the polynomial interpolation, the cubic spline interpolation, or another interpolation method.

Figure 22:
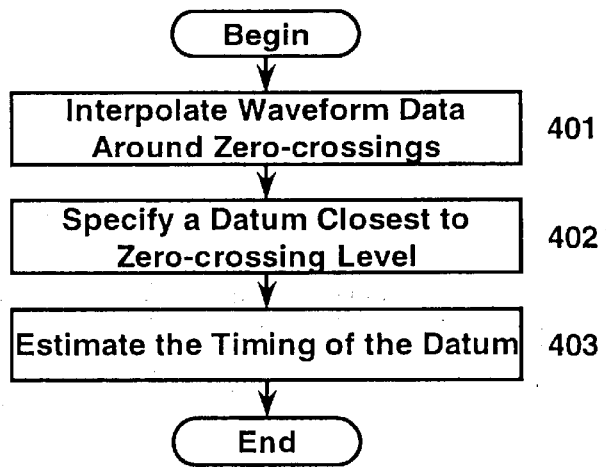
FIG. 22 is a flow-chart showing an example of a zero-crossing timing estimating method used in the jitter measuring method according to the present invention.

Next, the operation in the case of estimating a zero-crossing timing of a signal under measurement using the zero-crossing timing estimator 300 will be described with reference to FIG. 22. First, in step 401, waveform data around a zero-crossing are estimated by the waveform data interpolator 301 in sufficiently detail by the interpolation method using measured data close to the zero-crossing of the signal under measurement. Next, in step 402, a waveform data closest to a zero-crossing level out of the estimated waveform data is specified by the zero-crossing detector 302. Finally, in step 403, a timing on a time axis of the specified waveform data is obtained by the timing estimator 303, and the process ends.

Figure 23:
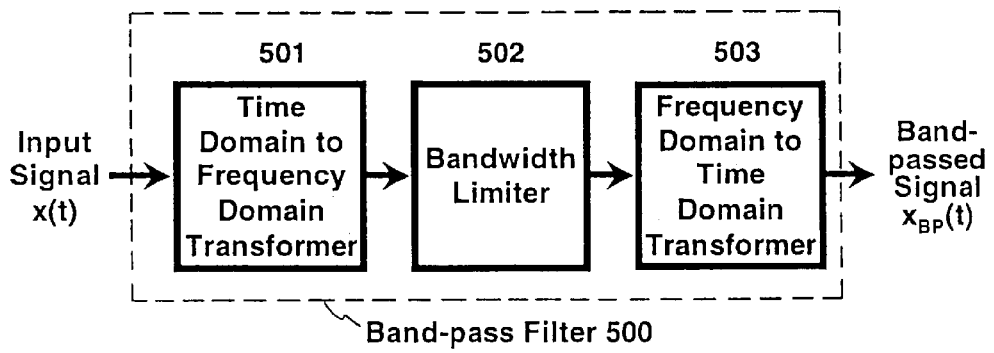
FIG. 23 is a diagram showing an example of a configuration of band-pass filtering means used in the jitter measurement apparatus according to the present invention.

FIG. 23 shows a configuration example of the band-pass filter 102 used in the jitter measurement apparatus 100. This band-pass filter 500 comprises a time domain to frequency domain transformer 501 for transforming a signal under measurement into a signal in frequency domain, a bandwidth limiter 502 for taking out, from an output of the time domain to frequency domain transformer 501, only components around a fundamental frequency of the signal under measurement, a frequency domain to time domain transformer 503 for inverse-transforming an output of the bandwidth limiter 502 into a signal in time domain. The time domain to frequency domain transformer 501 and the frequency domain to time domain transformer 503 may be packaged using FFT and inverse FFT, respectively.

Figure 24:
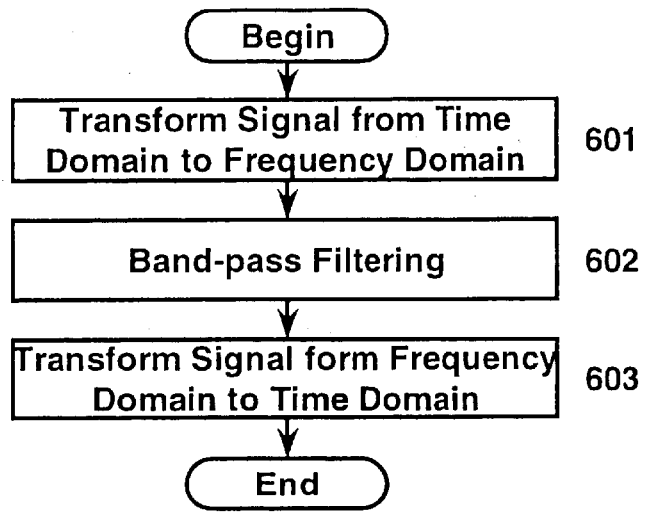
FIG. 24 is a flow-chart showing an example of a band-pass filtering method used in the jitter measurement apparatus according to the present invention.

The operation in the case of performing a bandwidth limitation of a signal under measurement using the band-pass filter 500 will be described with reference to FIG. 24. First, in step 601, FFT is applied to the signal under measurement by the time domain to frequency domain transformer 501 to transform the signal in time domain into a signal in frequency domain. Next, in step 602, regarding the transformed signal in frequency domain, only components around a fundamental frequency of the signal under measurement are retained and the other frequency components are replaced by zero, whereby the signal in frequency domain is band-limited. Finally, in step 603, inverse FFT is applied, by the frequency domain to time domain transformer 503, to the band-limited signal in frequency domain to transform the signal in frequency domain into the signal in time domain, and the process ends.

Figure 25:
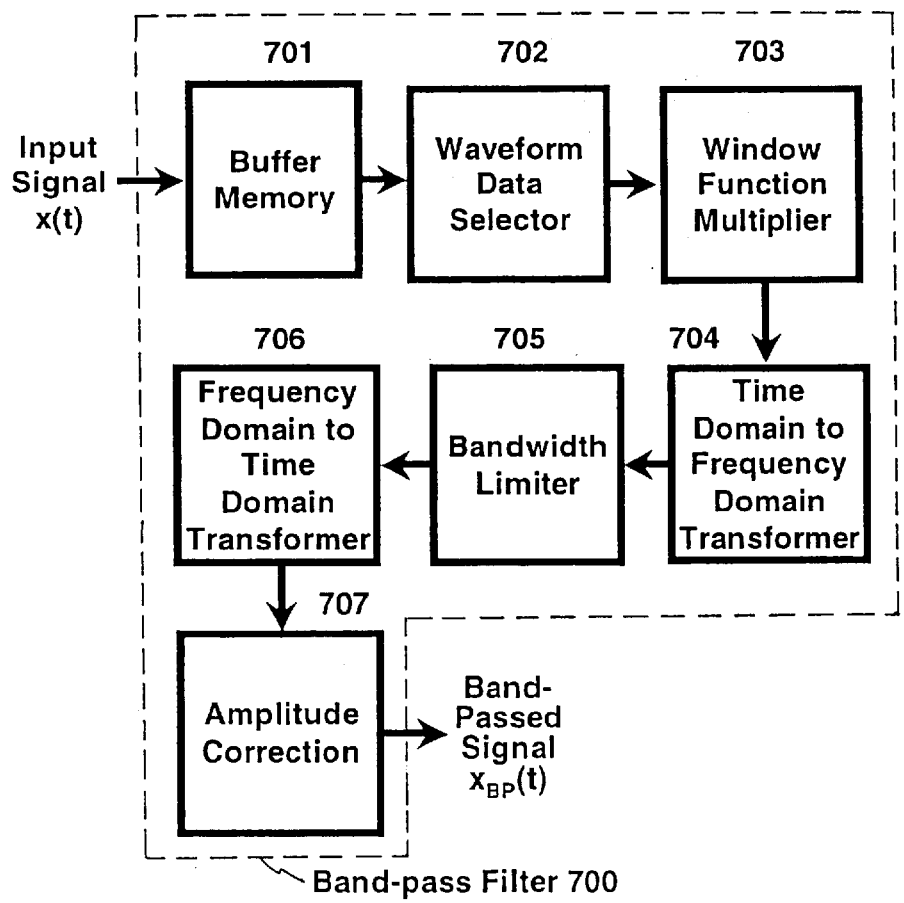
FIG. 25 is a diagram showing another example of the configuration of the band-pass filtering means used in the jitter measurement apparatus according to the present invention.

FIG. 25 shows another configuration example of the band-pass filter 102 used in the jitter measurement apparatus 100. This is used when a signal under measurement is long. This band-pass filter 700 comprises a buffer memory 701 for storing therein a signal under measurement, a data selector 702 for taking out in the sequential order from the buffer memory 701 the signal such that the signal being taken out is partially overlapped with a signal taken out just before, a window function multiplier 703 for multiplying each taken out partial signal by a window function, a time domain to frequency domain transformer 704 for transforming each multiplied partial signal into a signal in frequency domain, a bandwidth limiter 705 for taking out only components around a fundamental frequency of the signal under measurement, a frequency domain to time domain transformer 706 for inverse-transforming an output of the bandwidth limiter 705 into a signal in time domain, and an amplitude corrector 707 for multiplying the transformed signal in time domain by an inverse number of the window function and for taking out its central portion on the time axis such that the central portion is continuous with the previously processed signal to obtain a band-limited signal. The time domain to frequency domain transformer 704 and the frequency domain to time domain transformer 706 may be packaged using FFT and inverse FFT, respectively.

Figure 26:
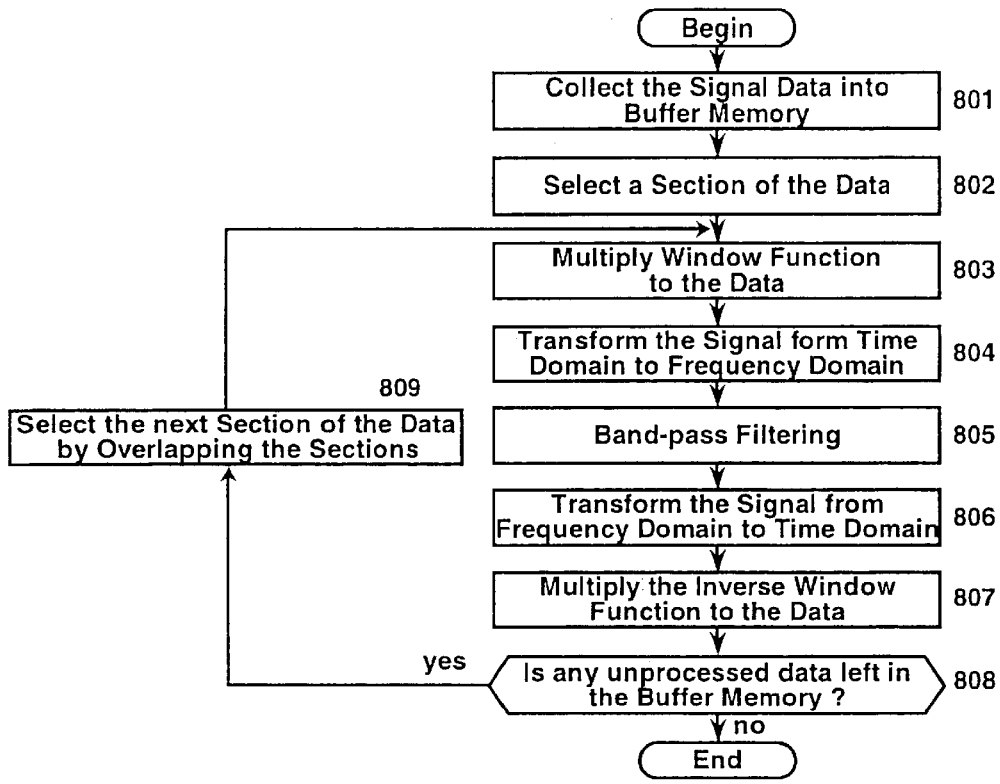
FIG. 26 is a flow-chart showing another example of the band-pass filtering method used in the jitter measuring method according to the present invention.

The operation in the case of performing a bandwidth limitation of a signal under measurement using the band-pass filter 700 will be described with reference to FIG. 26. First, in step 801, the signal under measurement is stored in the buffer memory 701. Next, in step 802, a portion of the stored signal is taken out by the data selector 702 from the buffer memory 701. Then, in step 803, the taken out partial signal is multiplied by a window function by the window function multiplier 703. Next, in step 804, FFT is applied to the partial signal that has been multiplied by the window function by the time domain to frequency domain transformer 704 to transform the signal in time domain into a signal in frequency domain. Next, in step 805, regarding the transformed signal in frequency domain, only components around a fundamental frequency of the signal under measurement are retained and the other frequency components are replaced by zero, whereby the signal in frequency domain is band-limited. Next, in step 806, inverse FFT is applied, by the frequency domain to time domain transformer 706, to the band-limited signal in frequency domain to transform the signal in frequency domain into a signal in time domain. Next, in step 807, the inverse transformed signal in time domain is multiplied, by the amplitude corrector 707, by an inverse number of the window function that was used for the multiplication in the step 803, and a central portion of the multiplied result on the time axis is taken out such that the central portion is continuous with the previously processed signal to obtain a band-limited signal. Finally, in step 808, a check is made to see if there is any unprocessed data in the buffer memory. If there is any unprocessed data, in step 809, the signal is taken out in the sequential order by the data selector 702 from the buffer memory 701 such that the signal being taken out is partially overlapped with a signal under measurement taken out just before, and thereafter the steps 803, 804, 805, 806, 807 and 808 are repeated. If there is no unprocessed data in the step 808, the process ends.

Figure 27:
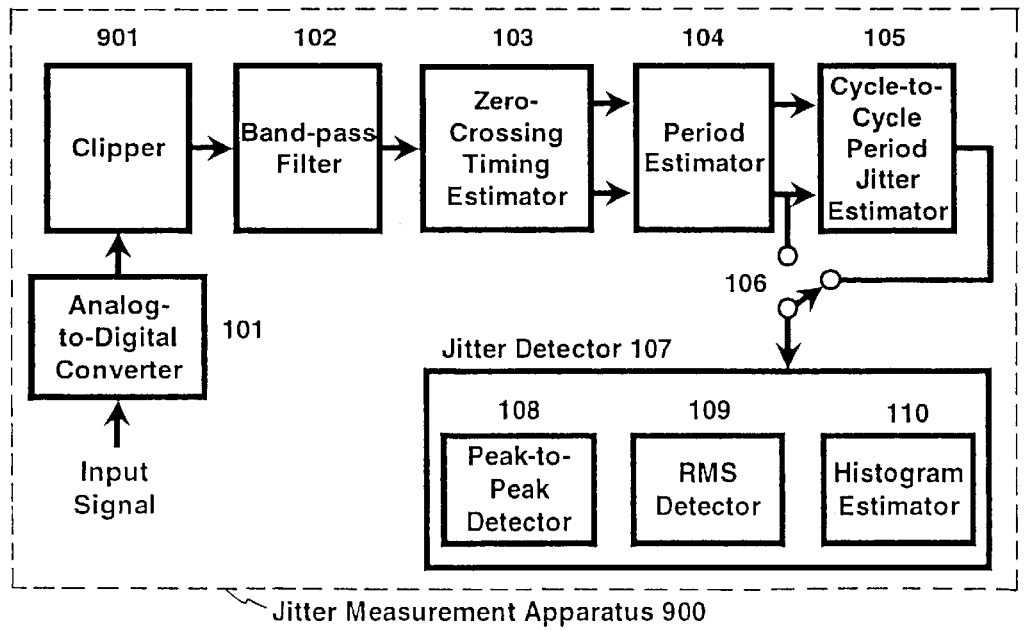
FIG. 27 is a diagram showing another example of the functional configuration of the jitter measurement apparatus according to the present invention.

FIG. 27 shows another embodiment of the jitter measurement apparatus according to the present invention. Portions in FIG. 27 corresponding to those in FIG. 19 have the same reference numbers affixed thereto as those in FIG. 19. This jitter measurement apparatus 900 is same as the jitter measurement apparatus shown in FIG. 19 except that a waveform clipper 901 for removing AM components of a signal is inserted between the AD converter 101 and the band-pass filter 102. The explanation of the overlapped portions will be omitted.

Figure 28:
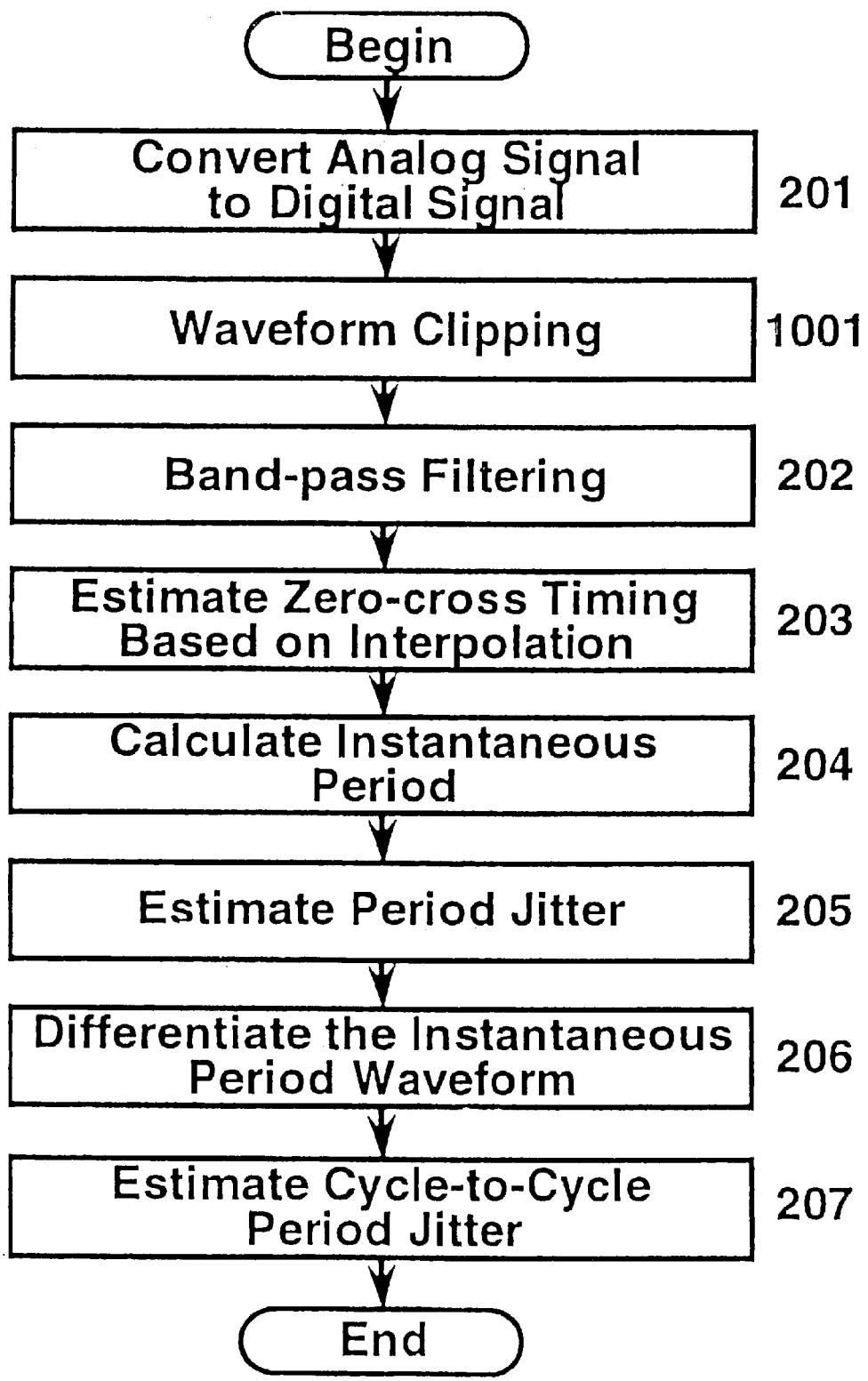
FIG. 28 is a flow-chart showing another example of the jitter measuring method according to the present invention.

The operation in the case of performing a jitter measurement using the jitter measurement apparatus 900 shown in FIG. 27 will be described with reference to FIG. 28. The jitter measuring method in this case is same as the jitter measuring method shown in FIG. 20 except that there is included a step 1001 for converting an analog signal under measurement whose jitter is to be measured into a digital signal using AD converter 101, and for removing thereafter AM components of the signal under measurement using a waveform clipper 901. The explanation of the overlapped portions will be omitted.

In the jitter measurement apparatus and the jitter measuring method according to the present invention, as indicated by a dashed line in FIG. 19, an analog signal under measurement is band-limited by a band-pass filter 112, and thereafter the band-limited signal is supplied to the AD converter 101 so that the band-pass filter 102 may be omitted. In this case the band-pass filter is constituted by an analog filter.

As described above, according to the jitter measurement apparatus and the jitter measuring method according to the present invention, since a zero-crossing timing is obtained from a band-limited signal, a period jitter can be obtained with high accuracy. Particularly, in the case of interpolating data around the zero-crossing of the band-limited signal, a correct interpolation can be performed, and a zero-crossing timing can be obtained with much higher accuracy. Therefore a period jitter can be obtained with high accuracy. Consequently, since a jitter value having compatibility with the time interval analyzer method can be estimated, the accuracy of a jitter measurement by a conventional interpolation method (provided in an oscilloscope) can significantly be improved.

What is claimed is:

1. A jitter measurement apparatus comprising:
   a band-pass filter to which a signal under measurement is inputted for passing therethrough and outputting components around its fundamental frequency;
   a zero-crossing timing estimator to which an output signal of said band-pass filter is inputted for estimating zero-crossing timings of the signal to output the zero-crossing timing data;
   a period estimator to which the zero-crossing timing data are inputted for obtaining and outputting instantaneous period waveform data of the signal under measurement from those inputted data; and
   a jitter detector to which the instantaneous period waveform data are inputted for obtaining and outputting jitters of the signal under measurement.

2. The jitter measurement apparatus according to claim I further including:
   an AD converter inserted in series into either one of input side and output side of said band-pass filter for converting an inputted analog signal into a digitized digital signal.

3. The jitter measurement apparatus according to claim 2 wherein said zero-crossing timing estimator comprises:
   a waveform data interpolator to which waveform data that have passed through said band-pass filter and have been converted into digital signals by said AD converter are inputted for data-interpolating data around the zero-crossing of the waveform data;
   a zero-crossing detector to which the data interpolated waveform data are inputted for specifying a waveform data closest to the zero-crossing in the interpolated waveform data; and
   a timing estimator to which the specified waveform data is inputted for estimating its timing and for outputting the estimated timing as a zero-crossing timing.

4. The jitter measurement apparatus according to claim 3 wherein said band-pass filter comprises:
   a time domain to frequency domain transformer for transforming the signal under measurement into a signal in frequency domain;
   a bandwidth limiter for taking out only components around a fundamental frequency of the signal under measurement from the transformed signal in frequency domain; and
   a frequency domain to time domain transformer for inverse-transforming the output signal of said bandwidth limiter into a signal in time domain.

5. The jitter measurement apparatus according to claim 3 further including:
   a cycle-to-cycle period jitter estimator to which the instantaneous period waveform data are inputted, said cycle-to-cycle period jitter estimator being inserted between said period estimator and said jitter detector for calculating a differential waveform of the instantaneous period waveform data to output cycle-to-cycle period jitter waveform data to said jitter detector.

6. The jitter measurement apparatus according to claim 3 further including:
   a waveform clipper for removing amplitude modulation components of the signal under measurement.

7. A jitter measuring method comprising the steps of:
   a band-pass filtering step for taking out, from a signal under measurement, components around its fundamental frequency;
   a zero-crossing timing estimating step for estimating zero-crossing timings of the taken out components around the fundamental frequency;
   a step of obtaining instantaneous period waveform data of the signal under measurement from the estimated zero-crossing timing data; and
   a jitter detecting step for obtaining jitters of the signal under measurement from the instantaneous period waveform data.

8. The jitter measuring method according to claim 7 further including the step of:
   a step of converting an analog signal into a digitized digital signal;
   wherein at least the zero-crossing timing estimating step and following steps are processed by digital processing.

9. The jitter measuring method according to claim 8 wherein said zero-crossing timing estimating step comprises the steps of;
   a waveform data interpolating step for data-interpolating data around the zero-crossing of the waveform data that are digital signals around the fundamental frequency;
   a step of specifying a waveform data closest to a zero-crossing among the data-interpolated waveform data; and
   a step of estimating a timing of the specified waveform data to define the estimated timing as the zero-crossing timing.

10. The jitter measuring method according to claim 8 wherein said band-pass filtering step comprises the steps of:
   a step of transforming the signal under measurement into a signal in frequency domain;
   a step of taking out only components around a fundamental frequency of the signal under measurement from the transformed signal in frequency domain; and a step of inverse-transforming the taken out components around the fundamental frequency into a signal in time domain.

11. The jitter measuring method according to claim 10 further comprising:
   a step of storing the signal under measurement in a buffer memory;
   a step of taking out in the sequential order the signal under measurement from said buffer memory such that the signal under measurement being taken out is partially overlapped with a signal under measurement taken out just before;
   a step of multiplying each partial signal taken out from said buffer memory by a window function, and moving to said time domain to frequency domain transforming step so that the multiplied partial signal is transformed into frequency domain; and
   a step of multiplying the signal inverse-transformed in time domain by an inverse number of the window function.

12. The jitter measuring method according to claim 8 further including the step of:
   a step of calculating a differential waveform of the instantaneous period waveform data and obtaining a cycle-to-cycle period jitter waveform data to output the cycle-to-cycle period jitter waveform data to said jitter detecting step.

13. The jitter measuring method according to claim 12 wherein said jitter detecting step is a step of obtaining the cycle-to-cycle period jitter of the signal under measurement from the cycle-to-cycle period jitter waveform data.

14. The jitter measuring method according to claim 8 further including the step of removing amplitude modulation components of the signal under measurement.

15. The jitter measuring method according to claim 8 wherein said waveform data interpolating step is a step of performing a data interpolation by polynomial interpolation.

16. The jitter measuring method according to claim 8 wherein said zero-crossing timing estimating step is a step of estimating a zero-crossing timing using inverse linear interpolation from waveform data around a zero-crossing among the components around the fundamental frequency.

17. The jitter measuring method according to claim 8 wherein said jitter detecting step is a step of obtaining a period jitter of the signal under measurement from the instantaneous period waveform data.

18. The jitter measuring method according to claim 8 wherein said jitter detecting step is a step of obtaining a difference between the maximum value and the minimum value of waveform data to obtain a value.

19. The jitter measuring method according to claim 8 wherein said jitter detecting step is a step of calculating a variance of the waveform data to obtain the standard deviation.

20. The jitter measuring method according to claim 8 wherein said jitter detecting step is a step of obtaining a histogram of the waveform data.

* * * * *